US007164320B2

(12) United States Patent
Felder et al.

(10) Patent No.: US 7,164,320 B2
(45) Date of Patent: Jan. 16, 2007

(54) CURRENT THRESHOLD CIRCUIT

(75) Inventors: Matthew D. Felder, Austin, TX (US); Marcus W. May, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 58 days.

(21) Appl. No.: 11/009,110

(22) Filed: Dec. 10, 2004

(65) Prior Publication Data

US 2006/0125568 A1 Jun. 15, 2006

(51) Int. Cl.
*H03F 3/04* (2006.01)

(52) U.S. Cl. .................................................... 330/298

(58) Field of Classification Search .................... None
See application file for complete search history.

(56) References Cited

U.S. PATENT DOCUMENTS

| | | | | |
|---|---|---|---|---|
| 4,277,755 | A * | 7/1981 | Fausone et al. | 330/128 |
| 4,410,859 | A * | 10/1983 | Kuwahara | 330/298 |
| 4,860,154 | A * | 8/1989 | Fazlollahi | 361/101 |
| 5,162,671 | A * | 11/1992 | Ishihara | 327/74 |
| 5,363,063 | A * | 11/1994 | Laot et al. | 330/298 |
| 5,384,549 | A * | 1/1995 | Araki | 330/298 |
| 5,877,655 | A * | 3/1999 | Maige | 330/298 |
| 6,064,266 | A * | 5/2000 | Anderson et al. | 330/284 |
| 6,489,813 | B1 * | 12/2002 | Kulhalli et al. | 327/77 |
| 6,867,652 | B1 * | 3/2005 | Hastings et al. | 330/298 |
| 6,980,058 | B1 * | 12/2005 | Noro | 330/298 |

* cited by examiner

*Primary Examiner*—Robert Pascal
*Assistant Examiner*—Krista Flanagan
(74) *Attorney, Agent, or Firm*—Garlick Harrison & Markison; Timothy W. Markison

(57) ABSTRACT

A current threshold circuit includes a series impedance, a reference voltage source, and a comparison module. The series impedance couples an output of a current source to a load, wherein impedance of the series impedance is substantially less than impedance of the load. The reference voltage source is operably coupled to produce a reference voltage differential. The comparison module is operably coupled to compare the reference voltage differential with a differential voltage of the series impedance, wherein the comparison module generates an excessive current indication when the differential voltage of the series impedance compares unfavorably to the reference voltage differential.

19 Claims, 8 Drawing Sheets high current output circuit 10 function of comparison module 32

CURRENT THRESHOLD CIRCUIT

BACKGROUND OF THE INVENTION

1. Technical Field of the Invention

This invention relates generally to integrated circuits and more particularly to excessive output current detection of such integrated circuits.

2. Description of Related Art

Integrated circuits (IC) are known to be used in a multitude of electronic devices and are required to provide sufficient output power to driver components coupled to the IC. For example, an audio processing IC (e.g., audio codec, MP3 player, etc.) has at least one output to drive headphones. To protect an IC from an overload and/or short circuit on such a high powered output, the IC includes a current limiting circuit.

FIG. 1 is an embodiment of a known output current limit circuit that includes an output drive transistor ($T_{out}$) and a temperature sensing circuit that is in the vicinity of the transistor. The output drive transistor provides an output current to a load via an IC pin. If the output current becomes excessive, the output drive transistor heats up, which is sensed by the temperature sensing circuit. When the temperature of the output drive transistor becomes too high, due an overload or a short, the temperature sense circuit provides an overload current signal to a processor, which disables the output drive transistor. While such a circuit provides overload protection, it does so at the cost of a temperature sensing circuit, which may not respond fast enough to avoid overloading the power rails.

FIG. 2 is a schematic block diagram of another known current sensing circuit. In this embodiment, a sense resistor ($R_{sense}$) is coupled in series with the load ($R_{load}$) off chip. The output transistor, which is on chip, drives the series combination of the resistive load and the sense resistor. An amplifier, or comparator, monitors the voltage across the sense resistor with respect to a reference voltage. When the voltage across the sense resistor exceeds a voltage reference, a current limit signal ($I_{sense}$) is produced. While this provides overload protection, it does at the cost an additional sense pin for each output. Further, the sense resistor adds impedance to the output, which lowers the overall effeciency of the output due to its power consumption and reduces the voltage swing of the output.

FIG. 3 is another embodiment of a known current limiting circuit for an output of an integrated circuit. In this embodiment, a limiting resistor ($R_{limit}$) is coupled in series with the resistive load ($R_{load}$). The limiting resistor is on-chip with the output transistor ($T_{out}$) and has an impedance substantially equal to the resistive load. An issue with this embodiment is the loss of voltage output swing for the resistive load as well as the inefficiency due to power consumption of the limiting resistor.

FIG. 4 is yet another embodiment of a known current limiting circuit. In this embodiment, the output transistor $T_{out}$ drives the load resistance and the output current is mirrored to a sense circuit. The sense circuit includes a current mirroring transistor, a sense resistor and a comparator, or amplifier. In operation, the output current is mirrored by the mirroring transistor, where the mirrored current is provided to the sense resistor ($R_{sense}$). The sense resistor produces a sensed voltage based on the mirrored current, where the sense current is compared with a reference voltage. When the sensed voltage exceeds the reference voltage, an overload condition ($I_{sense}$) exists. An issue with this embodiment of a current limiting circuit is that when the output voltage swings from rail-to-rail, the drain source voltage of the output transistor has a wide variation, which causes the mirroring transistor to produce an inaccurate mirroring current. Such inaccurate current mirroring cause unacceptable variations in the current limiting function.

Therefore, a need exists for a current threshold and/or limiting circuit that overcomes the drawbacks of previous current limiting and/or current sensing circuits.

BRIEF SUMMARY OF THE INVENTION

The current threshold circuit of the present invention substantially meets these needs and others. In one embodiment, a current threshold circuit includes a series impedance, a reference voltage source, and a comparison module. The series impedance couples an output of a current source to a load, wherein impedance of the series impedance is substantially less than impedance of the load. The reference voltage source is operably coupled to produce a reference voltage differential. The comparison module is operably coupled to compare the reference voltage differential with a differential voltage of the series impedance, wherein the comparison module generates an excessive current indication when the differential voltage of the series impedance compares unfavorably to the reference voltage differential.

In another embodiment, a current threshold circuit includes a current mirroring transistor, a cascode transistor, a feedback module, and a sensing module. The current mirroring transistor is operably coupled to an output transistor of a current source. The cascode transistor is operably coupled in series with the current mirroring transistor. The feedback module is operably coupled to generate a gate voltage for the cascode transistor such that a drain voltage of the current mirroring transistor substantially equals a drain voltage of the output transistor. The sensing module is operably coupled to compare a representation of a current of the current mirroring transistor with a representation of a reference current level, wherein the sensing module generates an excessive current indication of the output transistor when the representation of the current of the current mirroring transistor compares unfavorably with the representation of the reference current level.

DETAILED DESCRIPTION OF THE INVENTION

Figure 1:
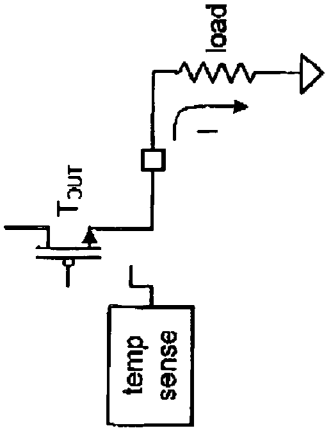
FIG. 1 (prior art)
FIGS. 1–4 are schematic block diagrams of prior art current sensing circuits.
Figure 2:
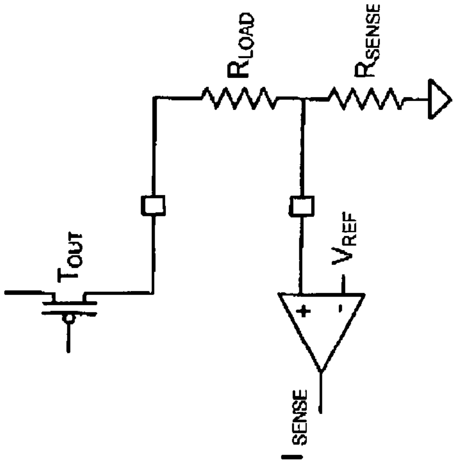
FIG. 2 (prior art)
Figure 3:
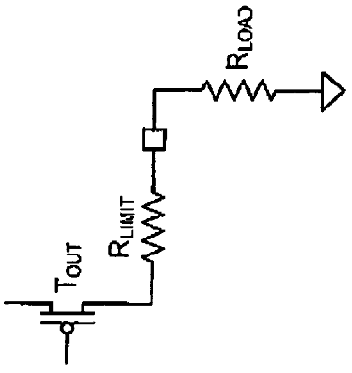
FIG. 3 (prior art)
Figure 4:
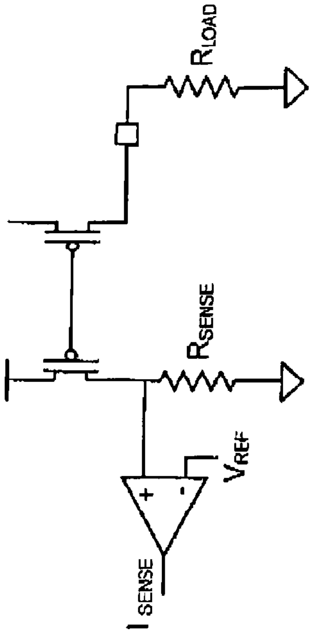
FIG. 4 (prior art)
Figure 5:
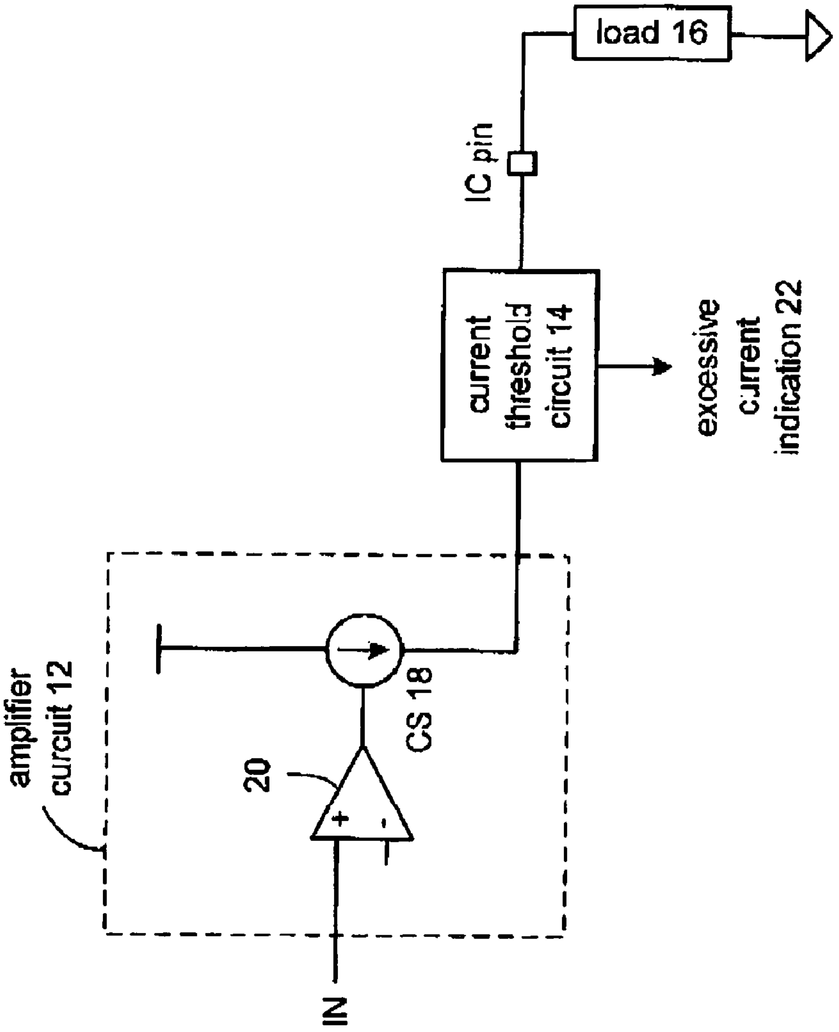
FIG. 5 is a schematic block diagram of a high current output circuit in accordance with the present invention.

FIG. 5 is a schematic block diagram of a high current output circuit 10 that includes an amplifier circuit 12, a current threshold circuit 14, an integrated circuit (IC) pin and a load 16. The amplifier circuit 12 and the current threshold circuit 14 are implemented on an integrated circuit while the load is typically off-chip. The amplifier circuit 12 may be an amplifier and/or a line driver. The load may be a speaker, headphone, et cetera.

The amplifier circuit 12 includes an amplifier 20 and a current source 18. The output of the amplifier 20 regulates the current produced by current source 18. In one embodiment, the amplifier 20 may be connected as an amplifier where the positive input is coupled to receive an input signal and the negative input is coupled to a reference voltage or other reference source. Alternatively, the amplifier circuit 12 may be used as a line driver where the positive input of the amplifier receives the input signal and the negative input of the amplifier is coupled to the output of the amplifier producing a unity gain amplifier. As one of ordinary skill in the art will appreciate, the amplifier 20 may be configured in a multitude of ways including, but not limited to, inverting single-ended amplifier and a differential amplifier. The current source 18 may include one or more output transistors that provide current to the load via the current sense threshold 14 and the integrated circuit pin.

The current threshold circuit 14 is operably coupled to sense the current provided by the current source 18 to the load 16. When the current exceeds a pre-determined threshold, the current threshold circuit 14 generates an excessive current indication. Other circuitry on the integrated circuit interprets the excessive current indication 22 to adjust the amplifier circuit 12 by reducing the current it provides and/or by disabling the amplifier circuit 12. For example, if the IC pin is shorted to ground, the current threshold circuit 14 generates an excessive current indication 22 which may be used to disable the amplifier circuit 12.

Figure 6:
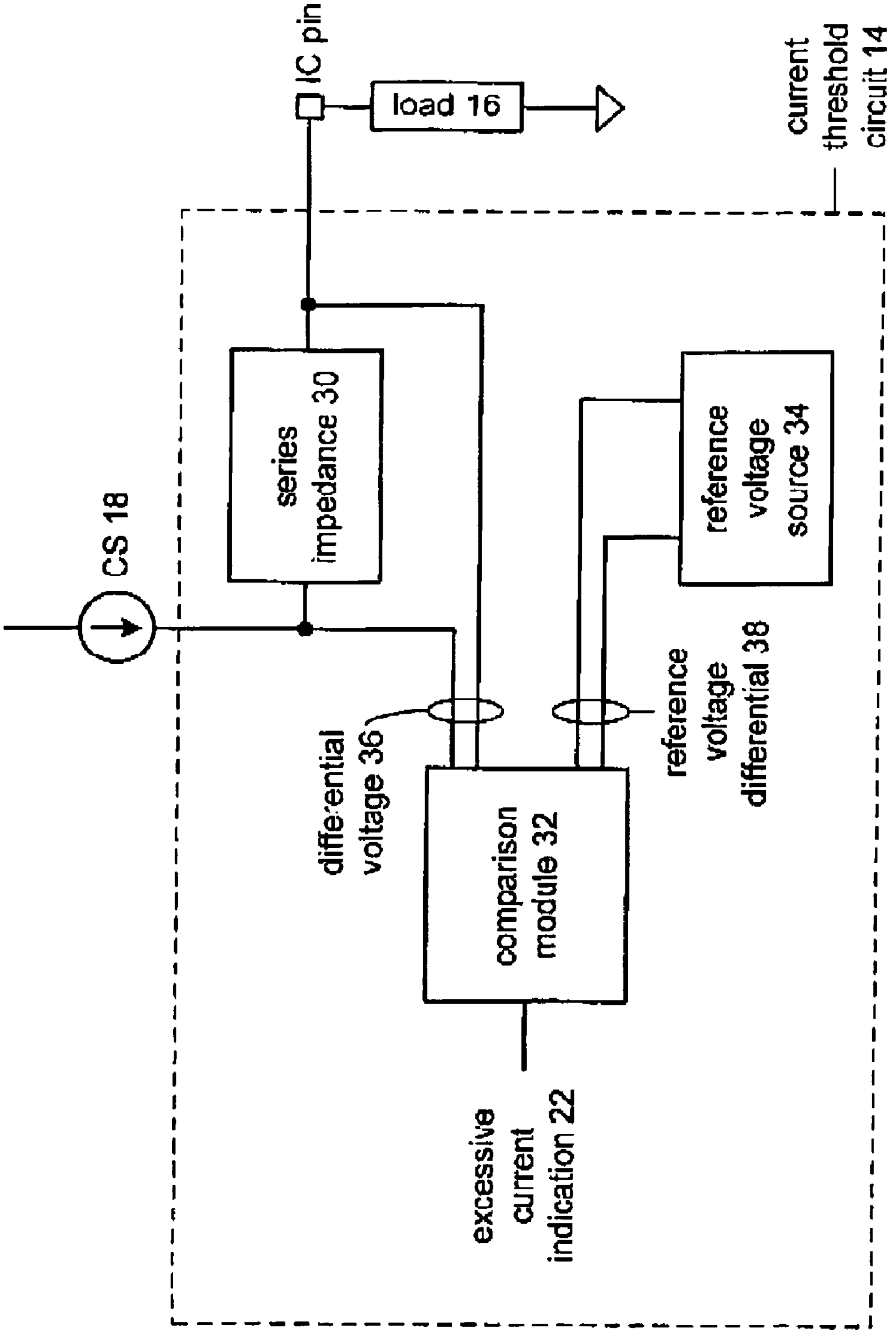
FIG. 6 is a schematic block diagram of a current threshold circuit in accordance with the present invention.

FIG. 6 is a schematic block diagram of an embodiment of the current threshold circuit 14. In this embodiment, the current threshold circuit includes a series impedance 30, a comparison module 32, and a reference voltage source 34. The series impedance 30 is coupled in series with the current source 18 of the amplifier circuit 12 and with the load 16 via the integrated circuit pin. The comparison module 32 has two pairs of inputs. The $1^{st}$ pair of inputs receives the voltage imposed across the series impedance 30 as a differential voltage 36. The other pair of inputs of the comparison module is provided by the reference voltage source 34 as a reference voltage differential 38.

The comparison module 32 compares the differential voltage 36, which represents the voltage imposed across the series impedance 30, with the reference voltage differential 38 to produce the excessive current indication 22. In this implementation, the comparison module 32 substantially reduces issues related to common mode voltage of sensing an on-chip series impedance and/or issues related to rail-to-rail swings of the output. Further note that the impedance of the series impedance 30 is substantially less than the impedance of the load 16. For instance, the series impedance 30 is no more than $1/10^{th}$ the impedance of the load 16.

Figure 7:
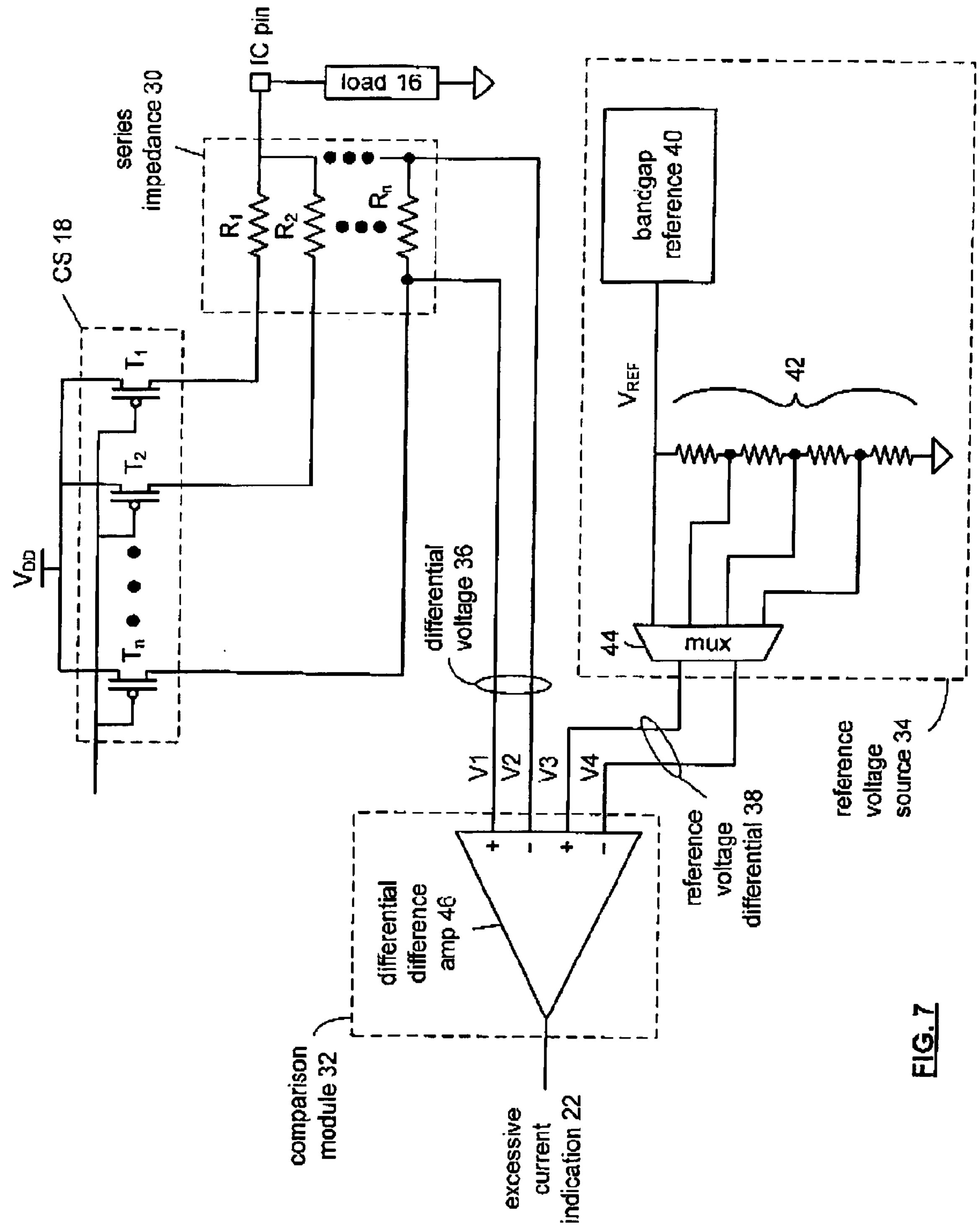
FIG. 7 is a schematic block diagram of another embodiment of a current threshold circuit in accordance with the present invention.

FIG. 7 is a schematic block diagram of another embodiment of the current threshold circuit 14. In this embodiment, the current source 18 includes a plurality of output transistors $T_1$–$T_n$. The series impedance 30 includes a plurality of resistors $R_1$–$R_n$. The comparison module 32 includes a differential difference amplifier 46 and the reference voltage source 34 includes a band-gap reference 40, a resistive divider 42 and a multiplexer 44.

As shown, each of the output transistors of the current source 18 is coupled to a corresponding resistor of the series impedance 30. The other node of each of the resistors in the series impedance 30 is coupled to the integrated circuit pin to drive the load 16. In one embodiment, one of the resistors within the series impedance 30 may be sensed to provide the differential voltage 36.

The voltage reference source 34 produces the reference voltage differential 38 by generating a reference voltage (Vref) via the band-gap reference 40. The resistive divider 42 produces a plurality of reference voltages from the reference voltage. The multiplexer 44 is enabled to select two of the plurality of reference voltages, including the original reference voltage produced by the band-gap reference 40, to produce the reference voltage differential 38. Depending on the desired current limit threshold and the voltage drop across the sense resistor within the series impedance, the reference voltage differential 38 may be selected to have a relatively small differential value or a relatively large differential value. As an alternative configuration, the multiplexer 44 may only have one output to select a voltage for the negative leg of the reference voltage differential 38 and the band-gap reference 40 provides the positive leg of the reference voltage differential 38.

The differential difference amplifier 46 amplifies the differential voltage 36 with respect to the reference voltage differential 38 to produce the excessive current indication 22.

Figure 8:
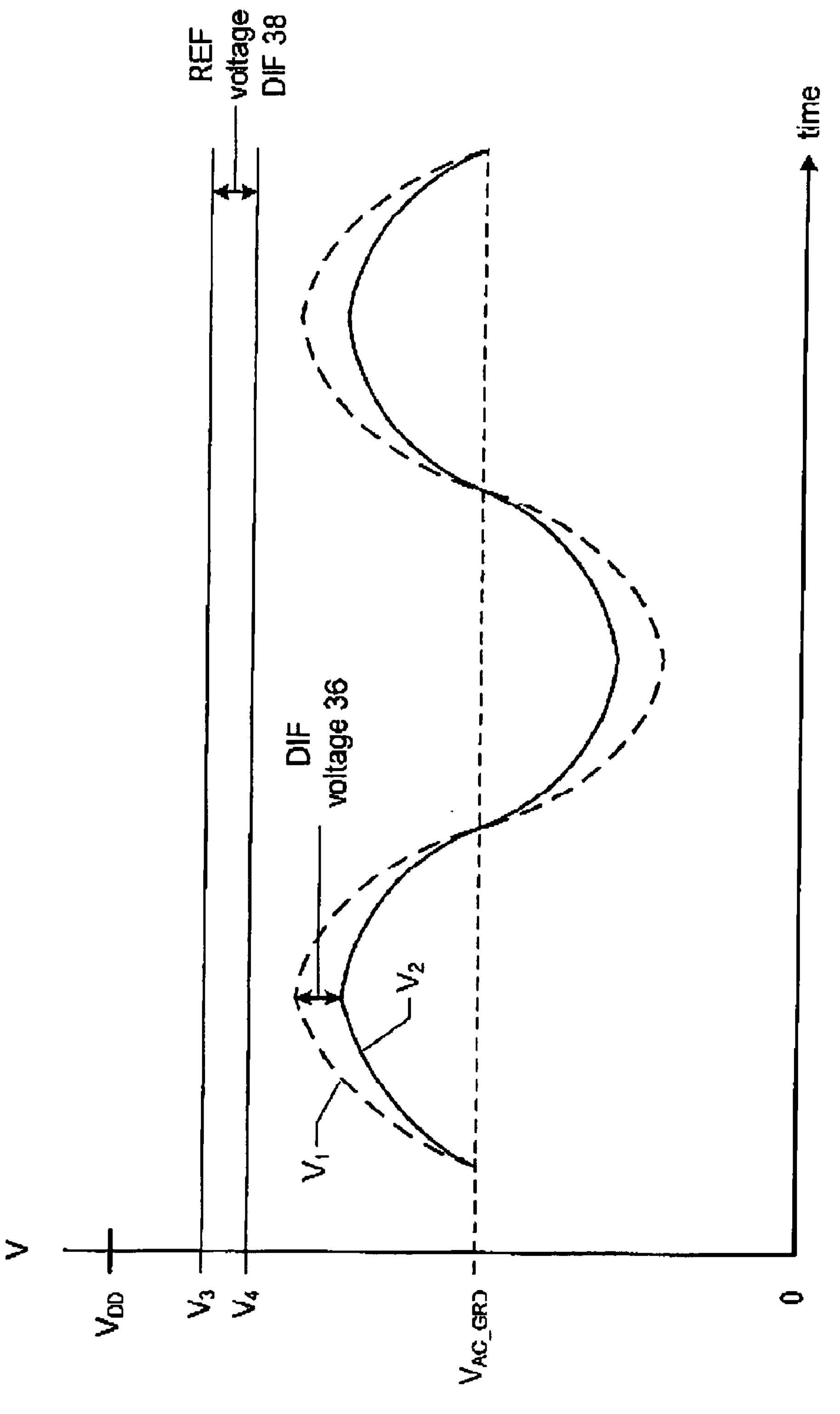
FIG. 8 is a graph depicting the function of the comparison module of the current threshold circuit in accordance with the present invention.

FIG. 8 illustrates the functionality of the comparison module 32. In this embodiment the voltage across the load ($V_{LOAD}$) is represented over time and swings essentially from rail-to-rail ($V_{SS}$ to $V_{DD}$). With reference to FIG. 7, one node of the series impedance is coupled to the load and thus tracks the output voltage ($V_{LOAD}$). The other node of the series impedance 32, with respect to the first node, provides the differential voltage 36, which is based on the output current and the impedance of the series impedance. Thus, as the output current increases, the differential voltage 36 increases.

FIG. 8 further illustrates the reference voltage differential 38 as V3 minus V4. V3 may correspond to the bandgap reference voltage or the greater of the two voltages outputted by the multiplexer 44 and V4 corresponds to the lesser of the two voltages outputted by the multiplexer 44 or the single output of the multiplexer 44. The differential voltage 36 is illustrated as V1 minus V2, where V1 and V2 correspond to the voltage drop across the series impedance 30. In accordance with this embodiment, the amplifier output equals gain*[(V1−V2)−(V3−V4)]. If the difference between V1 and V2 ever exceeds the difference between V3 and V4, then the excessive current indication is generated.

Figure 9:
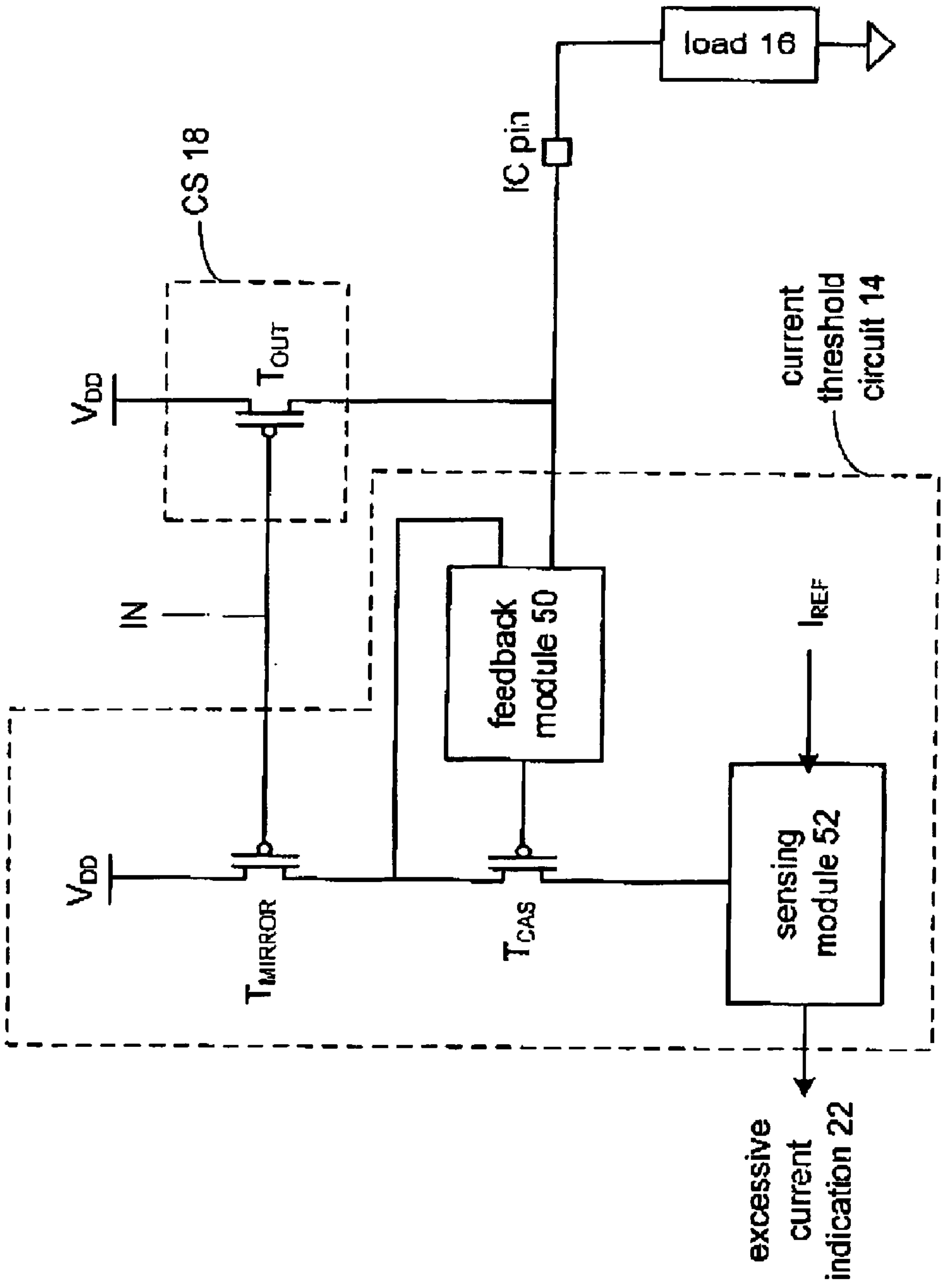
FIG. 9 is a schematic block diagram of another embodiment of a current threshold circuit in accordance with the present invention.

FIG. 9 is a schematic block diagram of another embodiment of a current sense threshold 14 operably coupled to an output transistor of current source 18, which provides an output current to load 16 via an integrated circuit pin. In this embodiment, the current sense threshold circuit 14 includes a mirroring transistor ($T_{mirror}$), a cascode transistor ($T_{cas}$), a feedback module 50 and a sensing module 52. In this embodiment, the mirroring transistor mirrors the current provided by the output transistor of current source 18. The cascode transistor is gated via the feedback module, which keeps the drain voltage of the mirror transistor matching the drain voltage of the output transistor of current source 18 to insure accurate mirroring of the current produced by the output transistor as the output voltage swings from rail-to-rail.

The sensing module 52 is operably coupled to compare a representation of the current produced by the current mirroring transistor with a representation of a reference current ($I_{ref}$). The sensing module generates an excessive current indication 22 when the representation of the current produced by the current mirroring transistor compares unfavorably with the representation of the reference current level. Note that the representation of the currents produced by the mirroring transistor and the reference current may correspond to voltage signals, current signals and/or digital values produced via an analog-to-digital conversion.

Figure 10:
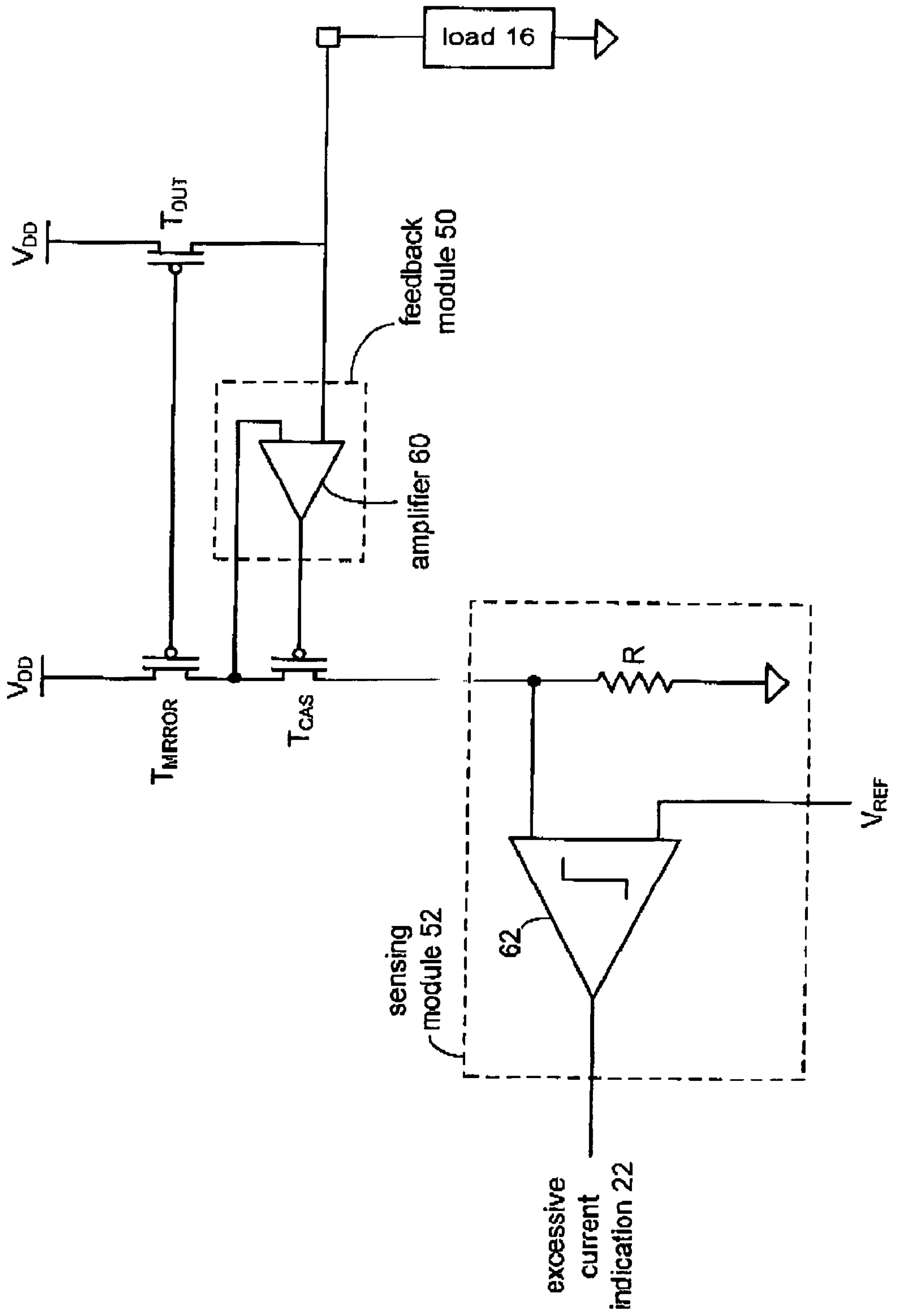
FIG. 10 is a schematic block diagram of yet another embodiment of a current threshold circuit in accordance with the present invention.

FIG. 10 is a schematic block diagram of another embodiment of a current threshold circuit 14. In this embodiment, the current threshold circuit 14 includes the feedback circuit 50, the mirroring transistor, the cascode transistor and the current sense module 52 operably coupled to the output transistor of current source 18. In this embodiment, the feedback module 50 includes an amplifier 60 and the current sense module 52 includes a sense resistor R and a comparator 62.

In operation, the amplifier 60 provides a gate voltage to the cascode transistor that ensures that the drain voltage of the mirroring transistor matches or substantially matches the drain voltage of the output transistor $T_{out}$ of current source 18. By maintaining this drain voltage relationship, the mirroring transistor will accurately mirror the current of the output transistor even as the output voltage swings from rail-to-rail.

The sense resistor produces a voltage which represents the mirrored current. The voltage is compared with a reference voltage via comparator 62 to produce the excessive current indication 22 when the voltage imposed across the sense resistor R exceeds the reference voltage. Note that the sense resistor may be an on-chip resistor or an off-chip resistor. If an off-chip resistor is used, a more accurate representation of the mirror current may be produced since the tolerance of an off-chip resistor can be much greater than is obtainable via an on-chip resistor.

Figure 11:
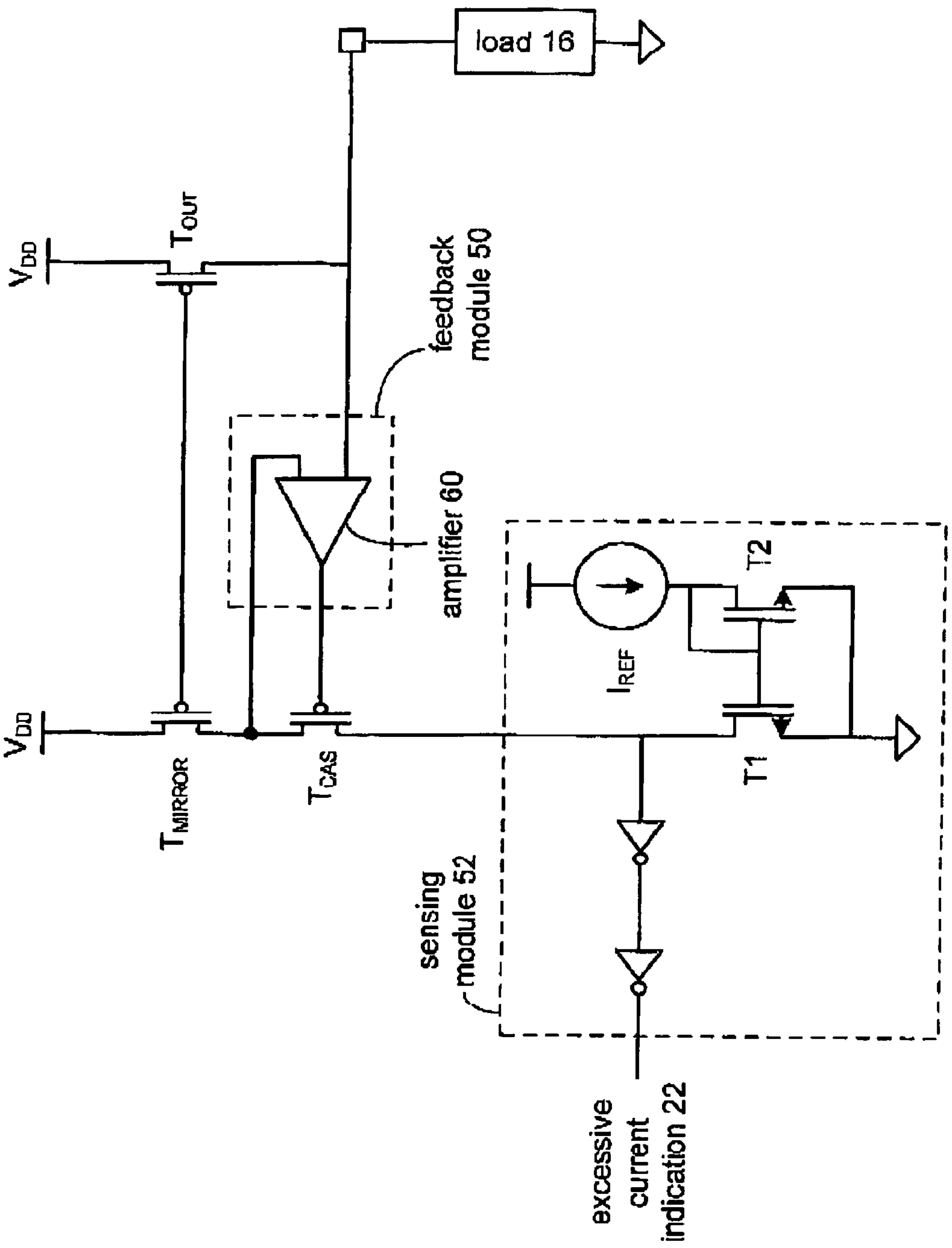
FIG. 11 is a schematic block diagram of yet a further embodiment of a current threshold circuit in accordance with the present invention.

FIG. 11 is a schematic block diagram of another embodiment of a current threshold circuit 14. In this embodiment, the current threshold circuit 14 includes the feedback circuit 50, the mirroring transistor, the cascode transistor and the current sense module 52 operably coupled to the output transistor of current source 18. In this embodiment, the feedback module 50 includes an amplifier 60 and the current sense module 52 includes a reference current source, a pair of transistors T1, T2, and a buffer (e.g., a pair of inverters).

In operation, the amplifier 60 provides a gate voltage to the cascode transistor that ensures that the drain voltage of the mirroring transistor matches or substantially matches the drain voltage of the output transistor $T_{out}$ of current source 18. By maintaining this drain voltage relationship, the mirroring transistor will accurately mirror the current of the output transistor even as the output voltage swings from rail-to-rail.

The sensing module 52 produces the excessive current indication 22 when the current through the mirroring transistor, and hence transistor T1 of the sensing module 52, produces a drain source voltage on transistor T1 that exceeds a logic one input of the inverter. In this embodiment, the gate source voltage of T1 is established by transistor T2 and the reference current source. Based on the known voltage level for a logic one input of the inverter and the properties of transistors T1 and T2, the reference current source can be set at a desired level to establish a desired gate source voltage, which in turn establishes the drain source voltage of T1.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled". As one of ordinary skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented various embodiments of a current threshold circuit. Regardless of the embodiment, other circuits within an integrated circuit may use the excessive current indication to protect the output of the integrated circuit from damage due to short circuits and/or overload conditions. As one of average skill in the art will appreciate, other embodiments may be derived from the teaching of the present invention without deviating from the scope of the claims.

What is claimed is:

1. A current threshold circuit comprises:

a series impedance coupling an output of a current source to a load, wherein impedance of the series impedance is substantially less than impedance of the load;

a reference voltage source operably coupled to produce a reference voltage differential; and a comparison module operably coupled to compare the reference voltage differential with a differential voltage of the series impedance, wherein the comparison module generates an excessive current indication when the differential voltage of the series impedance compares unfavorably to the reference voltage differential.

2. The current threshold circuit of claim 1, wherein comparison module comprises:

a differential difference amplifier having a first set of inputs to receive the reference voltage differential and a second set of inputs to receive the differential voltage of the series impedance.

3. The current threshold circuit of claim 1, wherein the reference voltage source comprises:

a band gap reference operably coupled to produce a reference voltage;

a resistive divider operably coupled to divide the reference voltage into a plurality of reference voltages; and a multiplexer operably coupled to select the reference voltage differential from two of the reference voltage and the plurality of reference voltages.

4. The current threshold circuit of claim 1 further comprises:

the output of the current source including a plurality of transistors; and the series impedance including a plurality of resistors, wherein one node of each of the plurality of resistors is coupled to a corresponding one of the plurality of transistors and wherein the other node of each of the plurality of resistors are coupled together, wherein the differential voltage of the series impedance is provided by one of the plurality of transistors.

5. The current threshold circuit of claim 1, wherein the current source comprises at least one of:

an output of an amplifier; and an output of a line driver.

6. A current threshold circuit comprises:

a current mirroring transistor operably coupled to a output transistor of a current source;

a cascode transistor operably coupled in series with the current mirroring transistor;

a feedback module operably coupled to generate a gate voltage for the cascode transistor such that a drain voltage of the current mirroring transistor substantially equals a drain voltage of the output transistor; and a sensing module operably coupled to compare a representation of a current of the current mirroring transistor with a representation of a reference current level, wherein the sensing module generates an excessive current indication of the output transistor when the representation of the current of the current mirroring transistor compares unfavorably with the representation of the reference current level.

7. The current threshold circuit of claim 6, wherein the feedback module comprises:

an amplifier having a first input, a second input, and an output, wherein the first input is coupled to a drain of the output transistor, the second input is coupled to a drain of the cascode transistor, and the output is coupled to a gate of the cascode transistor.

8. The current threshold circuit of claim 6, wherein the sensing module comprises:

an off chip resistor coupled to a source of the cascode transistor to produce the representation of the current of the current mirroring transistor; and a comparator operably coupled to compare a voltage imposed across the off chip resistor with a reference voltage that corresponds to the representation of the reference current level.

9. The current threshold circuit of claim 6, wherein the sensing module comprises:

an on chip resistor coupled to a source of the cascode transistor to produce the representation of the current of the current mirroring transistor; and a comparator operably coupled to compare a voltage imposed across the on chip resistor with a reference voltage that corresponds to the representation of the reference current level.

10. The current threshold circuit of claim 6, wherein the representation of the current of the current mirroring transistor and the representation of a reference current level each comprise at least one of:

a voltage signal;

a current signal; and a digital value produced by an analog to digital converter.

11. A high current output circuit of an integrated circuit (IC), wherein the high circuit output circuit comprises:

an amplifier circuit that includes an output current source; and a current threshold circuit that includes:

a series impedance coupling an output of the output current source to a load, wherein impedance of the series impedance is substantially less than impedance of the load;

a reference voltage source operably coupled to produce a reference voltage differential; and a comparison module operably coupled to compare the reference voltage differential with a differential voltage of the series impedance, wherein the comparison module generates an excessive current indication when the differential voltage of the series impedance compares unfavorably to the reference voltage differential.

12. The high current output circuit of claim 11, wherein comparison module comprises:

a differential difference amplifier having a first set of inputs to receive the reference voltage differential and a second set of inputs to receive the differential voltage of the series impedance.

13. The high current output circuit of claim 11, wherein the reference voltage source comprises:

a band gap reference operably coupled to produce a reference voltage;

a resistive divider operably coupled to divide the reference voltage into a plurality of reference voltages; and a multiplexer operably coupled to select the reference voltage differential from two of the reference voltage and the plurality of reference voltages.

14. The high current output circuit of claim 11 further comprises:

the output of the current source including a plurality of transistors; and the series impedance including a plurality of resistors, wherein one node of each of the plurality of resistors is coupled to a corresponding one of the plurality of transistors and wherein the other node of each of the plurality of resistors are coupled together, wherein the differential voltage of the series impedance is provided by one of the plurality of transistors.

15. A high current output circuit of an integrated circuit (IC), wherein the high circuit output circuit comprises:

an amplifier circuit that includes an output current source; and a current threshold circuit that includes:

a current mirroring transistor operably coupled to a output transistor of the output current source;

a cascode transistor operably coupled in series with the current mirroring transistor;

a feedback module operably coupled to generate a gate voltage for the cascode transistor such that a drain voltage of the current mirroring transistor substantially equals a drain voltage of the output transistor; and a sensing module operably coupled to compare a representation of a current of the current mirroring transistor with a representation of a reference current level, wherein the sensing module generates an excessive current indication of the output transistor when the representation of the current of the current mirroring transistor compares unfavorably with the representation of the reference current level.

16. The high current output circuit of claim 15, wherein the feedback module comprises:

an amplifier having a first input, a second input, and an output, wherein the first input is coupled to a drain of the output transistor, the second input is coupled to a drain of the cascode transistor, and the output is coupled to a gate of the cascode transistor.

17. The high current output circuit of claim 15, wherein the sensing module comprises:

an off chip resistor coupled to a source of the cascode transistor to produce the representation of the current of the current mirroring transistor; and a comparator operably coupled to compare a voltage imposed across the off chip resistor with a reference voltage that corresponds to the representation of the reference current level.

18. The high current output circuit of claim 15, wherein the sensing module comprises:

an on chip resistor coupled to a source of the cascode transistor to produce the representation of the current of the current mirroring transistor; and a comparator operably coupled to compare a voltage imposed across the on chip resistor with a reference voltage that corresponds to the representation of the reference current level.

19. The high current output circuit of claim 15, wherein the representation of the current of the current mirroring transistor and the representation of a reference current level each comprise at least one of:

a voltage signal;

a current signal; and a digital value produced by an analog to digital converter.

* * * * *